(12) United States Patent
Murakami et al.

(10) Patent No.: US 11,299,807 B2
(45) Date of Patent: Apr. 12, 2022

(54) SURFACE-COATED CUTTING TOOL IN WHICH HARD COATING LAYER EXHIBITS EXCEPTIONAL ADHESION RESISTANCE AND ANOMALOUS DAMAGE RESISTANCE

(71) Applicant: MITSUBISHI MATERIALS CORPORATION, Tokyo (JP)

(72) Inventors: Akihiro Murakami, Naka-gun (JP); Masaki Okude, Naka-gun (JP); Shin Nishida, Joso (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 66 days.

(21) Appl. No.: 16/641,262

(22) PCT Filed: Sep. 26, 2018

(86) PCT No.: PCT/JP2018/035576
§ 371 (c)(1),
(2) Date: Feb. 24, 2020

(87) PCT Pub. No.: WO2019/065683
PCT Pub. Date: Apr. 4, 2019

(65) Prior Publication Data
US 2020/0354838 A1 Nov. 12, 2020

(30) Foreign Application Priority Data

Sep. 29, 2017 (JP) .............................. JP2017-191384
Aug. 24, 2018 (JP) .............................. JP2018-157698

(51) Int. Cl.
*C23C 16/34* (2006.01)
*C23C 28/04* (2006.01)
(Continued)

(52) U.S. Cl.
CPC .......... *C23C 28/044* (2013.01); *C22C 29/005* (2013.01); *C22C 29/08* (2013.01);
(Continued)

(58) Field of Classification Search
CPC ....... B23B 27/14; B23B 27/148; C23C 16/34; C23C 28/044; C22C 29/08
(Continued)

(56) References Cited

U.S. PATENT DOCUMENTS 4,264,682 A * 4/1981 Fuyama .................. C23C 16/32
427/249.19
5,981,078 A * 11/1999 Tabersky ................ C23C 16/36
407/119
(Continued)

FOREIGN PATENT DOCUMENTS

CN 1445037 A 10/2003
CN 107002237 A 8/2017
(Continued)

OTHER PUBLICATIONS

International Search Report dated Dec. 18, 2018, issued for PCT/JP2018/035576 and English translation thereof.
(Continued)

*Primary Examiner* — Archene A Turner
(74) *Attorney, Agent, or Firm* — Locke Lord LLP; James E. Armstrong, IV; Nicholas J. DiCeglie, Jr.

(57) ABSTRACT

A surface-coated cutting tool in which a hard coating layer exhibits exceptional adhesion resistance and anomalous damage resistance is provided. This surface-coated cutting tool includes a tool body composed of a WC based cemented carbide or a TiCN based cermet; and at least one hard coating layer provided on a surface of the tool body, and; 1) the hard coating layer includes at least one complex nitride layer, 2) the complex nitride layer contains 0.001 to 0.030
(Continued)

atom % of chlorine, 3) in the complex nitride layer, an area ratio of longitudinal crystal grains having an aspect ratio equal to or greater than 2 occupying a longitudinal cross section is 50% or more, and 4) a layer thickness of the complex nitride layer is 0.2 µm to 20 µm.

5 Claims, 1 Drawing Sheet

(51) Int. Cl.
  *C22C 29/00* (2006.01)
  *C22C 29/08* (2006.01)
  *C23C 16/02* (2006.01)
  *C23C 16/32* (2006.01)
  *C23C 16/40* (2006.01)

(52) U.S. Cl.
  CPC .......... *C23C 16/0272* (2013.01); *C23C 16/32* (2013.01); *C23C 16/34* (2013.01); *C23C 16/403* (2013.01); *C23C 28/042* (2013.01)

(58) Field of Classification Search
  USPC ........... 51/307, 309; 426/336, 697, 698, 699
  See application file for complete search history.

(56) References Cited

U.S. PATENT DOCUMENTS

| | | | |
|---|---|---|---|
| 7,691,757 B2* | 4/2010 | Haukka | C23C 16/45546 427/255.394 |
| 2010/0260561 A1* | 10/2010 | Moriguchi | C23C 28/42 407/119 |
| 2015/0345013 A1* | 12/2015 | Paseuth | C23C 28/042 428/329 |
| 2016/0298233 A1 | 10/2016 | Sottke et al. | |

FOREIGN PATENT DOCUMENTS

| | | |
|---|---|---|
| EP | 3382058 A1 | 10/2018 |
| JP | 03-267361 A | 11/1991 |
| JP | H06-015505 A | 1/1994 |
| JP | H06-017228 A | 1/1994 |
| JP | 07-237030 A | 9/1995 |
| JP | 08-318407 A | 12/1996 |
| JP | 2000-288802 A | 10/2000 |
| JP | 2002-192401 A | 7/2002 |
| JP | 2009-148856 A | 7/2009 |
| JP | 2013-139065 A | 7/2013 |
| WO | 2017/090540 A1 | 6/2017 |

OTHER PUBLICATIONS

Supplementary European Search Report dated Mar. 11, 2021, issued for European Patent Application No. 18861841.7.

Office Action dated Sep. 14, 2020, issued for Chinese Patent Application No. 201880061908.X and an English translation of the Search Report.

* cited by examiner

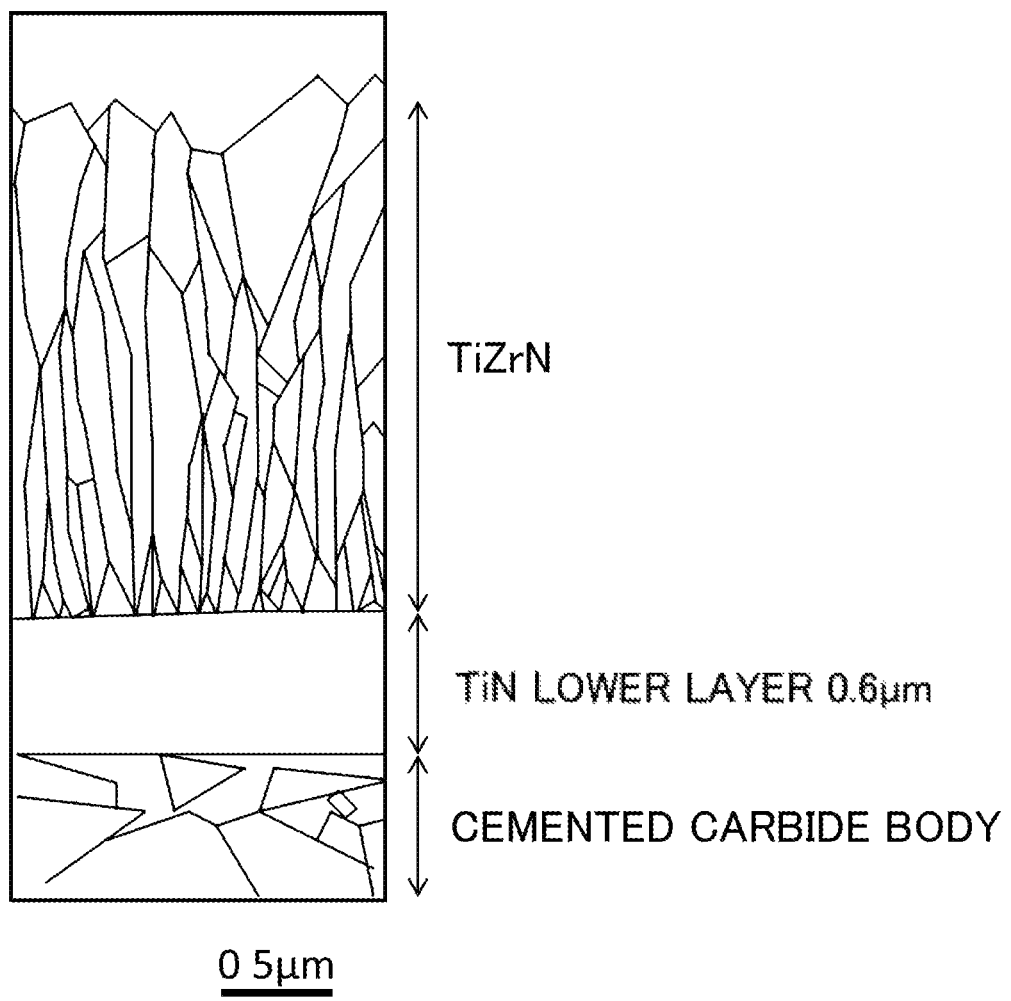

SURFACE-COATED CUTTING TOOL IN WHICH HARD COATING LAYER EXHIBITS EXCEPTIONAL ADHESION RESISTANCE AND ANOMALOUS DAMAGE RESISTANCE

TECHNICAL FIELD

The present invention relates to a surface-coated cutting tool in which a hard coating layer exhibits exceptional adhesion resistance and anomalous damage resistance during high feed intermittent cutting of steel during which high impact loads are exerted on cutting edges, and exceptional cutting performance is exhibited during long-term use.

BACKGROUND ART

In the related art, in general, in various cutting tools of steel, a coated tool in which a hard coating layer including a Ti compound layer such as Ti carbonitride (TiCN) layer formed by chemical vapor deposition as a lower layer, and an aluminum oxide layer formed by chemical vapor deposition as an upper layer is formed on a surface of a cemented carbide body such as tungsten carbide base, has been used.

However, in recent years, in the intermittent cutting of steel, it is required to achieve high efficiency. Meanwhile, a short lifetime of a tool due to adhesion or anomalous damage has become a problem, in the coated tool of the related art.

In regards to this, for example, PTL 1 has proposed realization of long lifetime by forming a TiZrN hard coating layer having high hardness and exceptional wear resistance by using a sputtering method or a plasma CVD method in the cutting tool or the like.

In addition, PTL 2 has proposed prevention of diffusion of a work piece and a cutter and improvement of reduction of productivity or a degradation of quality of a product due to adhesion or chipping occurred on an edge during the cutting of a steel pipe in the related art, by providing a ceramic coating layer formed of TiZrN or the like on a cemented carbide base material in which a hard phase is formed of WC and a metal bonding phase is formed of Co, Ni, and Cr, as a cutter used during the cutting of the steel pipe.

Furthermore, PTL 3 has proposed particular extension of lifetime of a tool, by using a cutting tool in which a film of TiZrN, TiHfN, or TiZrHfN having an fcc structure is formed on a body by a CVD method.

CITATION LIST

Patent Literature

[PTL 1] Japanese Unexamined Patent Application, First Publication No. H3-267361
[PTL 2] Japanese Unexamined Patent Application, First Publication No. H7-237030
[PTL 3] United States Patent Application, Publication No. 2016/0298233

DISCLOSURE OF INVENTION

Technical Problem

There has been a strong demand for power saving and energy saving during cutting in recent years. In accordance with this, a coated tool is used under severer conditions. Therefore, exceptional adhesion resistance and anomalous damage resistance are required even during the high feed intermittent cutting of steel.

However, in a case where the coated tools formed of coating layers including TiZrN, TiHfN, or TiZrHfN in the high feed intermittent cutting of steel, which are proposed in PTL 1 to PTL 3, these coating layers do not withstand plastic deformation, and grains are detached from the coating layers, anomalous wear proceeds, and the end of lifetime is still reached at an early stage.

Solution to Problem

Therefore, from the viewpoint described above, as a result of intensive studies, the inventors have found the following knowledge regarding a coated tool which has exceptional adhesion resistance and anomalous damage resistance during long-term use, and a length of the lifetime of which is also improved, even in a case where the coated tool is used during high feed intermittent cutting of steel during which high intermittent and impact loads are exerted on cutting edges.

That is, the inventors have found that, a nitride layer having a longitudinal crystal structure is obtained by forming a nitride layer comprising TiZrN or TiZrHfN under the restricted conditions, and in such a nitride layer, a grain boundary in a direction parallel to a tool body is reduced, and accordingly, the detachment of crystal grains hardly occurs, and the inventors have further found that, by including an extremely small amount of a chlorine content in nitride, for example, by limiting an upper limit thereof to approximately 0.030 at %, it is possible to exhibit a lubricating effect and prevent heat generation due to friction during the cutting, without occurrence of embrittlement of the coating layer, and accordingly, the plastic deformation of the coating layer hardly occurs, and it is possible to further prevent the detachment of the crystal grains.

It is also found that the coated cutting tool including the nitride layer as the hard coating layer has exceptional adhesion resistance and anomalous damage resistance, therefore, the length of the lifetime of the tool is improved for long-term use, as the coated cutting tool for high feed intermittent cutting of steel.

The invention is made based on the above-described knowledge and has the following aspects.

"(1) A surface-coated cutting tool including: a tool body composed of a WC based cemented carbide or a TiCN based cermet; and at least one hard coating layer provided on a surface of the tool body, in which 1) the hard coating layer includes at least one complex nitride layer in which, in a case where the complex nitride layer is expressed by a compositional formula $(Ti_{(1-x)}Zr_{xy}Hf_{x(1-y)})N$, x and y satisfy $0.05 \leq x \leq 0.95$ and $0 < y \leq 1.0$, respectively, where x is a content ratio of a total amount of Zr and Hf to a total amount of Ti, Zr, and Hf, and y is a content ratio of Zr to a total amount of Zr and Hf (here, all of x and y are atomic ratios), 2) the complex nitride layer contains 0.001 to 0.030 atom % of chlorine, 3) in the complex nitride layer, an area ratio of longitudinal crystal grains having an aspect ratio equal to or greater than 2 occupying a longitudinal cross section is 50% or more, and 4) a layer thickness of the complex nitride layer is 0.2 μm to 20 μm.

(2) The surface-coated cutting tool according to (1),
in which the complex nitride layer is characterized in that:
1) a nanoindentation hardness is equal to or greater than 2,600 kgf/mm$^2$, in a case where an indentation load is 200 mgf, and
2) a layer thickness is 1 μm to 20 μm."

Next, the coated tool of the invention will be described in detail.

Hard Coating Layer:

The invention relates to a surface-coated cutting tool including at least one hard coating layer on a surface of a tool body, and the hard coating layer includes a TiZrN complex nitride layer and/or a TiZrHfN complex nitride layer, and if necessary includes a lower layer and/or an upper layer.

TiZrN Complex Nitride Layer and/or TiZrHfN Complex Nitride Layer (1) Component Composition In a case where a TiZrN complex nitride and a TiZrHfN complex nitride configuring the TiZrN complex nitride layer and/or the TiZrHfN complex nitride layer according to the invention is expressed by a compositional formula $(Ti_{(1-x)}Zr_{xy}Hf_{x(1-y)})N$, x and y satisfy $0.05 \leq x \leq 0.95$ and $0 < y \leq 1.0$, respectively.

Here, x represents a content ratio of a total amount of Zr and Hf to a total amount of Ti, Zr, and Hf, and y is a content ratio of Zr to a total amount of Zr and Hf. Here, all of x and y are atomic ratios.

Hereinafter, the complex nitride layer is also referred to as a TiZrN nitride layer and a TiZrHfN nitride layer, or a TiZrN layer and a TiZrHfN layer.

In addition, by including an extremely small amount of chlorine which is 0.001 to 0.030 atom % in the TiZrN layer and the TiZrHfN layer, heat generation due to wear during the cutting is reduced and plastic deformation hardly occurs, due to a lubricating effect of chlorine.

Atom % of chlorine here indicates atom % of chlorine (Cl) in the TiZrN layer and the TiZrHfN layer with respect to a total amount of Ti, Zr, Hf, N, O (the complex nitride layer contains 1.5 atom % or less oxygen as inevitable impurity), and Cl, and in a case where the amount thereof exceeds 0.030 atom %, it causes embrittlement of the coating layer. Therefore, the amount thereof is limited to be equal to or smaller than 0.030 atom %.

(2) Longitudinal Crystal Structure

As described above, the TiZrN layer and the TiZrHfN layer configuring the hard coating layer according to the invention has a longitudinal crystal structure. By the TiZrN layer and the TiZrHfN layer having a longitudinal crystal structure, the detachment of grains from the coating layer is prevented, and exceptional adhesion resistance and anomalous damage resistance are exhibited, together with the effect obtained by including the extremely small amount of chlorine. The longitudinal crystal structure here indicates a structure in which an area ratio of longitudinal crystal grains having an aspect ratio equal to or greater than 2 occupying a longitudinal cross section of the nitride layer is 50% or more.

The aspect ratio here is specifically L/W in a case where a grain width and a grain length of each crystal grain in the layer regarding the longitudinal cross section of the nitride layer are measured, and a maximum grain width W and a maximum grain length L are obtained.

In a case where the aspect ratio is smaller than 2, sufficient longitudinal structure is not obtained, and the detachment of equi-axis crystals having a small aspect ratio is caused. As a result, sufficient wear resistance may not be exhibited. Therefore, the aspect ratio is set to be equal to or greater than 2.

By setting the area ratio of the longitudinal crystal grains having the aspect ratio equal to or greater than 2 to be 50% or more, it is possible to exhibit an effect of improving ductility and wear resistance.

(3) Average Layer Thickness and Hardness

The TiZrN nitride layer and the TiZrHfN nitride layer have high hardness and exceptional wear resistance, and particularly, exhibits exceptional effects, from a viewpoint of hardness and wear resistance, in a case where an average layer thickness is 0.2 μm to 20 μm.

In addition, in a case where the average layer thickness is 1 μm to 20 μm and a nanoindentation hardness (indentation load is 200 mgf) is equal to or greater than 2,600 kgf/mm$^2$, it is possible to exhibit more exceptional effects.

The average layer thickness of the nitride layer can be obtained by measuring and averaging layer thicknesses of five points in an observation visual field of a cross section in a direction orthogonal to the tool body, by using a scanning electron microscope (magnification of 5,000).

In addition, regarding the nanoindentation hardness, a surface of the TiZrN layer or the TiZrHfN layer was polished, and measurement was performed at an indentation load of 200 mgf by using Berkovich indenter made of diamond, based on a nanoindentation test method (ISO 14577).

Film Formation Method of TiZrN Layer and TiZrHfN Layer

The TiZrN layer and the TiZrHfN layer having the component composition set in the invention and having a specific longitudinal structure can be, for example, formed by sequentially performing processes under conditions shown in each step shown below, by using a chemical vapor deposition method shown below.

That is, the film formation method of the TiZrN layer and the TiZrHfN layer is comprising a first step (primary nucleus formation step), that is, a step of forming a TiZrN film and a TiZrHfN film which are primary nucleus for forming a TiZrN film and a TiZrHfN film, and a second step (crystal growth step), that is, a step of growing primary nuclei of the TiZrN film and the TiZrHfN film and forming the TiZrN film and the TiZrHfN film. In addition, the first step is comprising two steps which are an a step, that is, a seed film formation step of forming a ZrN film or a ZrHfN film which are seed films for a short period of time, and a b step, that is, an etching step of evenly etching a surface of the ZrN film or a ZrHfN film formed in the a step to form fine asperity, substituting a part of Zr with Ti, and obtaining fine TiZrN or TiZrHfN primary nucleus, in this order.

Hereinafter, the outline of the film formation conditions in each film formation step is shown, and particularly, the formation step of the fine TiZrN primary nucleus in the first step comprising the a step and the b step is an extremely important step. In the second step performed subsequently, the longitudinal crystal structure is grown by the crystal growth of the primary nucleus, and a suitable amount of chlorine is introduced to the coating layer.

Meanwhile, in order to obtain the TiZrN layer having the longitudinal crystal structure, it is extremely important to prevent a gas phase reaction of generating grain growth in a gas phase, and for example, in the a step of the first step, in a case of being exposed to a high temperature for a long period of time, in a state where $ZrCl_4$ and $N_2$ are mixed, grains grown in the gas phase are accumulated on the body and this is a hindrance to the growth of the longitudinal crystal structure. Accordingly, in order to shorten the reaction time $ZrCl_4$, and $HfCl_4$ and $N_2$, for example, it is necessary to use a CVD which periodically supplies $ZrCl_4$, $HfCl_4$, and $N_2$, and mixing these in the vicinity of a surface of the tool body, or a CVD device which supplies these gases by separating to a position sufficiently close to the body (although depending on a value of a gas flow rate, but 30 cm at most), and mixing these in the vicinity of a surface of the body, as a CVD device.

In a plasma CVD method for proceeding the gas phase reaction, a content of chlorine easily increases, and the structure of the longitudinal grains is hardly obtained. Therefore, it is difficult to manufacture the coating layer of the invention. In addition, in a case of using $NH_3$ gas, a content of chlorine extremely increases at a low temperature, and the gas phase reaction becomes extremely active at a high temperature. Therefore, the longitudinal structure is hardly obtained and it is difficult to manufacture the coating layer of the invention. In order to obtain the coating layer of the invention, it is preferable to use a thermal CVD method using only $N_2$ gas as an N source.

[Film Formation Conditions]
1) first step (primary nucleus formation step)
   a) Seed film (ZrN film.ZrHfN film) formation step
   Processing method: film formation using CVD method
   Reaction gas composition (volume %):
   Gas group A: $ZrCl_4$: 0.1 to 2.0,
      $HfCl_4$: 0.0 to 2.0,
      Here, $ZrCl_4+HfCl_4$: 1.0 to 2.0,
      HCl: 0.1 to 0.4, $H_2$: 40 to 85
   Gas group B: $N_2$: balance
   (Here, the gas composition of the gas group A and the gas group B shows volume % of each gas component, in a case where a total volume of the gas group A and the gas group B supplied per period is 100%.)
   Reaction atmosphere pressure: equal to or greater than 16 kPa and smaller than 35 kPa
   Reaction atmosphere temperature: equal to or higher than 1,000° C. and lower than 1,100° C.
   Supplying period: 2 to 10 seconds
   Gas supply time per one period: 0.15 to 0.60 seconds
   Phase difference between supply of gas group A and supply of gas group B: 0.15 to 0.60 seconds
   b) Etching step
   Processing method: dry etching
   Reaction gas composition (volume %):
   Gas group C: $TiCl_4$: 2.0 to 4.0, $H_2$: balance,
   Reaction atmosphere pressure: equal to or greater than 6 kPa and smaller than 12 kPa
   Reaction atmosphere temperature: equal to or higher than 1,000° C. and lower than 1,100° C.
   Processing time: 100 to 250 seconds
2) Second step (crystal growth step)
   Processing method: film formation using CVD method
   Reaction gas composition (volume %):
   Gas group D: $TiCl_4$: 0.2 to 0.7,
      $ZrCl_4$: 0.1 to 2.0,
      $HfCl_4$: 0.0 to 2.0,
      Here, $ZrCl_4+HfCl_4$: 1.0 to 2.0,
      HCl: 0.1 to 0.4,
      $H_2$: 40 to 85,
   Gas group E: $N_2$: balance
   (Here, the gas composition of the gas group D and the gas group E shows volume % of each gas component, in a case where a total volume of the gas group D and the gas group E supplied per period is 100%.)
   Reaction atmosphere pressure: equal to or greater than 16 kPa and smaller than 35 kPa
   Reaction atmosphere temperature: equal to or higher than 1,000° C. and lower than 1,080° C.
   Supplying period: 2 to 10 seconds
   Gas supply time per one period: 0.15 to 0.60 seconds
   Phase difference between supply of gas group D and supply of gas group E: 0.15 to 0.60 seconds Lower Layer and Upper Layer:

The hard coating layer according to the invention exhibits sufficient effects by providing the nitride layer comprising TiZrN or TiZrHfN. However, in a case where a lower layer comprising a Ti compound layer made of one layer or two or more layers of a Ti carbide layer, a Ti nitride layer, and a Ti carbonitride layer is provided, it is possible to increase adhesiveness between the tool body and the nitride layer comprising TiZrN or TiZrHfN. Therefore, it is possible to further prevent occurrence of anomalous damage such as fracture or peeling.

In a case where a total average layer thickness of the lower layer comprising the Ti compound layer is smaller than 0.1 μm, the effect of the lower layer is not sufficiently exhibited, and meanwhile, in a case where the total average layer thickness thereof is greater than 20 μm, the crystal grains are easily coarsened, and chipping easily occurs. Therefore, the total average layer thickness thereof is desirably 0.1 to 20 μm. Meanwhile, in a case where an upper layer comprising a Ti compound layer made of one layer or two or more layers of a Ti carbide layer, a Ti nitride layer, and a Ti carbonitride layer, or the Ti compound layer and an Al oxide layer is provided on the nitride layer comprising TiZrN or TiZrHfN, it is possible to improve wear resistance.

In a case where a total average layer thickness of the upper layer comprising the Ti compound layer and the Al oxide layer is smaller than 0.5 μm, the effect of the improving the wear resistance is not sufficiently exhibited, and meanwhile, in a case where the total average layer thickness thereof is greater than 20 μm, the crystal grains are easily coarsened, and chipping easily occurs. Therefore, the total average layer thickness thereof is desirably 0.5 to 20 μm.

In a case where both the lower layer and the upper layer are provided, the total of the total average layer thickness of the lower layer and the total average layer thickness of the upper layer is desirably equal to or smaller than 25 μm. This is because that, in case of a layer thickness equal to or greater than 25 μm, the adhesiveness between the tool body and the surface-coated layer is insufficient, and peeling easily occurs.

Advantageous Effects of Invention

Since the surface-coated cutting tool according to the invention includes the nitride layer having the longitudinal crystal structure and comprising the TiZrN layer or the TiZrHfN layer containing chlorine in a range of up to 0.030 atom %, as the hard coating layer formed on the surface of the tool body, high hardness, exceptional adhesion resistance, and anomalous damage resistance are applied. Therefore, exceptional properties are exhibited during the high feed intermittent cutting of steel, and the length of the lifetime of the tool is improved.

BRIEF DESCRIPTION OF DRAWINGS

FIG. 1 is an overall schematic view of a cross section structure SEM image of a surface-coated layer of the invention.

BEST MODE FOR CARRYING OUT THE INVENTION

Next, the coated tool of the invention will be described in more detail with reference to examples.

Examples

As raw material powders, a WC powder, a TiC powder, a ZrC powder, a TaC powder, an NbC powder, a $Cr_3C_2$ powder, a TiN powder, and a Co powder, all of which had an average grain size of 1 to 3 μm, were prepared, and the raw material powders were mixed in blending compositions shown in Table 1. Wax was further added thereto, and the mixture was blended in acetone by a ball mill for 24 hours and was dried in a vacuum. Thereafter, the resultant material was press-formed into green compacts having predetermined shapes at a pressure of 98 MPa, and the green compacts were sintered in a vacuum at 5 Pa under the condition that the green compacts were held at a predetermined temperature in a range of 1370° C. to 1470° C. for one hour. After the sintering, tool bodies A to C made of WC based cemented carbide with insert shapes according to ISO standard CNMG120408 were respectively manufactured.

In addition, as raw material powders, a TiCN (TiC/TiN=50/50 in terms of mass ratio) powder, a ZrC powder, a TaC powder, an NbC powder, a $Mo_2C$ powder, a WC powder, a Co powder, and an Ni powder, all of which had an average grain size of 0.5 to 2 μm, were prepared, and the raw material powders were mixed in blending compositions shown in Table 2, were subjected to wet mixing by a ball mill for 24 hours, and were dried. Thereafter, the resultant material was press-formed into green compacts at a pressure of 98 MPa, and the green compacts were sintered in a nitrogen atmosphere at 1.3 kPa under the condition that the green compacts were held at a temperature of 1,500° C. for one hour. After the sintering, tool bodies D and E made of TiCN based cermet with insert shapes according to ISO standard CNMG120408 were respectively manufactured.

Subsequently, each of these tool bodies A to E was inserted into a chemical vapor deposition device, and coated tool of the present inventions 1 to 14 were respectively manufactured in the following procedure.

(a) First, regarding the coated tools 6 to 14 of the present inventions, in which the lower layer is provided on the tool body, the Ti compound layer and/or the Al oxide layer as the lower layer having a desired layer thickness shown in Table 4 was vapor-deposited under the conditions shown in Table 3.

(b) Next, the film formation was performed on the tool body of Table 1 or Table 2 shown in tool body symbol, based on Table 6, under the film formation conditions of the formation symbol of TiZrN layer.TiZrHfN layer of the film formation step of the invention shown in Table 5, and the component composition, the aspect ratio, the layer thickness, and the nanoindentation hardness of the TiZrN layer.TiZrHfN layer of the coated tool of the present inventions 1 to 14 obtained are shown in Table 6.

(c) In addition, regarding the coated tool of the present inventions 10 and 11, the upper layer was provided on the TiZrN layer or TiZrHfN layer. Under the conditions shown in Table 3, the Ti compound layer and/or the Al oxide layer as the upper layer having a desired layer thickness shown in Table 6 was vapor-deposited.

In addition, for the purpose of comparison, coated tool of comparative examples 1 to 16 were respectively manufactured in the same procedure as in the coated tool of the present inventions 1 to 14. That is, (a) Regarding the coated tool of comparative examples 6 to 16 in which the lower layer was provided on the tool body, the Ti compound layer and/or the Al oxide layer as the lower layer having a desired layer thickness shown in Table 4 was vapor-deposited under the conditions shown in Table 3. (The lower layer of coated tool of comparative examples 15 and 16 has the same film formation condition and the same layer thickness as those in the coated tool of the present invention 9 and coated tool of comparative example 9)

(b) Next, the film formation was performed on the tool body of Table 1 or Table 2 shown in tool body symbol, based on Table 7, under the film formation conditions of the formation symbol of TiZrN layer or TiZrHfN layer of the film formation step of the comparative example shown in Table 5, and the component composition, the aspect ratio, the layer thickness, and the nanoindentation hardness of the TiZrN layer.TiZrHfN layer of the coated tool of the Comparative Examples 1 to 16 obtained are shown in Table 7. (Here, in a case where the coated tool of the Comparative Examples 15 and 16 and the coated tool of the present invention 9 are compared to each other, the body and the film formation condition are the same, but the film formation time of the TiZrHfN film is different.)

(c) In addition, regarding the coated tool of the Comparative Examples 10 and 11, the upper layer was provided on the TiZrN layer.TiZrHfN layer. Under the conditions shown in Table 3, the Ti compound layer and/or the Al oxide layer as the upper layer having a desired layer thickness shown in Table 7 was vapor-deposited.

Here, the measurement of the layer thickness of the TiZrN layer and the TiZrHfN layer of the coated tool of the present inventions 1 to 14 and the coated tool of comparative examples 1 to 16 was performed using a scanning electron microscope (magnification of 5000). First, polishing was performed so that a cross section in a direction orthogonal to the tool body at a position separated from a cutting edge by 100 μm on the rake face in the vicinity of the edge. Then, the TiZrN layer and the TiZrHfN layer was observed in a visual field at magnification of 5000 so as to include the position on the rake face separated from the cutting edge by 100 μm, layer thicknesses of five points in the observation visual field were measured and averaged to obtain an average layer thickness, and the results were shown in Tables 6 and 7.

In addition, regarding the average content ratio of Zr, the average content ratio of Hf, and the average content ratio of Ti in all metal elements (that is, Ti, Zr, and Hf) of the TiZrN layer or the TiZrHfN layer in the coated tool of the present inventions 1 to 14 and the coated tool of comparative examples 1 to 16, the measurement was performed on the 10 points of the polished surface described above at a position on the rake face separated from the cutting edge by 90 to 110 μm, by using an electron probe micro-analyzer (EPMA), and an average was obtained.

Then, x and y in the compositional formula $(Ti_{(1-x)}Zr_{xy}Hf_{x(1-y)})N$ was obtained from the average content ratio of Zr, the average content ratio of Hf, and the average content ratio of Ti in all metal elements (that is, Ti, Zr, and Hf). A ratio (atom %) of chlorine (Cl) in the TiZrN layer and the TiZrHfN layer to a total amount of Ti, Zr, Hf, N, O, and Cl was measured by the electron probe micro-analyzer.

In addition, regarding the TiZrN layer or the TiZrHfN layer in the coated tool of the present inventions 1 to 14 and the coated tool of comparative examples 1 to 16, longitudinal cross section observation of the TiZrN layer or the TiZrHfN layer in a range including the entire TiZrN layer or TiZrHfN layer was performed on the rake face in the vicinity of the edge over a width of 100 μm from the cutting edge by using a scanning electron microscope (magnification of 5000), the observation was performed from the longitudinal cross section side orthogonal to the surface of the tool body. Regarding each crystal grain, a maximum grain width W of the crystal grain in a direction parallel to the surface of the tool and a maximum grain length L in a direction orthogonal to the surface of the tool were measured, and the aspect ratio was calculated by L/W.

In addition, regarding the nanoindentation hardness of the TiZrN layer or the TiZrHfN layer in the coated tool of the present inventions 1 to 14 and the coated tool of comparative examples 1 to 16, the surface of the TiZrN layer or the TiZrHfN layer was polished, and measurement was performed at an indentation load of 200 mgf by using Berkovich indenter made of diamond, based on ISO 14577, and the results were shown in Tables 6 and 7.

TABLE 1

| | Type | Co | TiC | ZrC | TaC | NbC | $Cr_3C_2$ | TiN | WC |
|---|---|---|---|---|---|---|---|---|---|
| Tool body | A | 6.0 | 0.9 | 0.5 | — | 1.5 | — | 0.9 | Balance |
| | B | 8.0 | 1.2 | — | — | — | 0.5 | 1.2 | Balance |
| | C | 10.0 | 1.5 | 0.5 | 0.5 | 0.5 | — | 1.5 | Balance |

Blending composition (% by mass)

TABLE 2

| | Type | Co | Ni | ZrC | TaC | NbC | $Mo_2C$ | WC | TiCN |
|---|---|---|---|---|---|---|---|---|---|
| Tool body | D | 6.0 | 3.0 | 0.5 | — | 4.0 | 9.5 | 25.0 | Balance |
| | E | 12.0 | 3.0 | — | 1.0 | 4.0 | 9.5 | 10.0 | Balance |

Blending composition (% by mass)

TABLE 3

Formation conditions (pressure of reaction atmosphere is shown with kPa and temperature is shown with °C.)

| Hard coating layer Type | Formation symbol | Reaction gas composition (volume %) | Reaction atmosphere Pressure | Temperature |
|---|---|---|---|---|
| TiC layer | TiC | $TiCl_4$: 4.2%, $CH_4$: 8.5%, $H_2$: balance | 7 | 1020 |
| TiN layer | TiN | $TiCl_4$: 4.2%, $N_2$: 30%, $H_2$: balance | 30 | 900 |
| 1-TiCN layer | 1-TiCN | $TiCl_4$: 4.2%, $N_2$: 20%, $CH_3CN$: 0.6%, $H_2$: balance | 7 | 900 |

TABLE 3-continued

Formation conditions (pressure of reaction atmosphere is shown with kPa and temperature is shown with °C.)

| Hard coating layer Type | Formation symbol | Reaction gas composition (volume %) | Reaction atmosphere Pressure | Temperature |
|---|---|---|---|---|
| TiCN layer | TiCN | $TiCl_4$: 4.2%, $N_2$: 20%, $CH_4$: 4%, $H_2$: balance | 12 | 1020 |
| $\alpha$-$Al_2O_3$ layer | $\alpha$-$Al_2O_3$ | $AlCl_3$: 2.2%, $CO_2$: 6.5%, HCl: 2.2%, $H_2S$: 0.2%, $H_2$: balance | 7 | 1000 |
| $\kappa$-$Al_2O_3$ layer | $\kappa$-$Al_2O_3$ | $AlCl_3$: 3.0%, $CO_2$: 5.0%, $H_2S$: 0.3%, $H_2$: balance | 7 | 970 |

Note)
1-TiCN layer is a TiCN layer having a longitudinal growth crystal structure.

TABLE 4

| | | | Hard coating layer Lower layer (Numerical value at the bottom indicates desired average layer thickness (μm) of each layer.) | | |
|---|---|---|---|---|---|
| Type | | Tool body symbol | First layer | Second layer | Third layer |
| Coated tool of present invention, | 1 | A | — | — | — |
| | 2 | B | — | — | — |
| | 3 | C | — | — | — |
| Coated tool of comparative example | 4 | D | — | — | — |
| | 5 | E | — | — | — |
| | 6 | A | TiN (0.6) | — | — |
| | 7 | B | TiN (0.2) | 1-TiCN (8) | — |
| | 8 | B | TiN (0.2) | 1-TiCN (5) | $\alpha$-$Al_2O_3$ (3) |
| | 9 | B | TiN (0.2) | 1-TiCN (5) | $\kappa$-$Al_2O_3$ (3) |
| | 10 | B | TiN (0.2) | 1-TiCN (5) | — |
| | 11 | B | TiN (0.2) | 1-TiCN (3) | — |
| | 12 | C | TiC (0.5) | TiN (0.5) | TiCN (3) |
| | 13 | D | TiN (1) | — | — |
| | 14 | E | TiN (0.5) | TiC (0.5) | 1-TiCN (8) |

TABLE 5

Formation conditions of complex nitride layer (TiZrN layer · TiZrHfN layer)

| Formation of complex nitride layer (TiZrN layer · TiZrHfN layer) Formation Step | | First step (primary nucleus formation step) | | | | | | | |
|---|---|---|---|---|---|---|---|---|---|
| | | ZrN · ZrHfN film formation step | | | | | | | |
| | | Reaction gas group A composition (volume %) | | | | Gas group A | | Gas group B | |
| | | | | | | Reaction gas group B composition (volume %) | | | |
| | | | | | | Supply period (seconds) | Supply time per one period (seconds) | | |
| | symbol | $ZrCl_4$ | $HfCl_4$ | HCl | $H_2$ | | | $N_2$ | Supply period (seconds) | Supply time per one period (seconds) |
| Film formation step of present | A | 1.6 | 0.0 | 0.20 | 70.0 | 4.00 | 0.25 | Balance | 4.00 | 0.25 |
| | B | 0.1 | 1.4 | 0.30 | 70.0 | 2.50 | 0.17 | Balance | 2.50 | 1.17 |
| | C | 0.1 | 1.5 | 0.20 | 70.0 | 4.00 | 0.25 | Balance | 4.00 | 0.25 |
| | D | 1.6 | 0.0 | 0.20 | 70.0 | 8.00 | 0.50 | Balance | 8.00 | 0.50 |

TABLE 5-continued

| | | | | | | | | | | |
|---|---|---|---|---|---|---|---|---|---|---|
| invention | E | 1.5 | 0.3 | 0.35 | 45.0 | 4.00 | 0.25 | Balance | 4.00 | 0.25 |
| | F | 1.2 | 0.0 | 0.15 | 80.0 | 4.00 | 0.25 | Balance | 4.00 | 0.25 |
| | G | 1.5 | 0.3 | 0.20 | 45.0 | 4.00 | 0.25 | Balance | 4.00 | 0.25 |
| Film formation step of comparative example | a | 1.5 | 0.3 | 0.20 | 45.0 | 4.00 | 0.25 | Balance | 4.00 | 0.25 |
| | b | \*primary nucleus formation step is not performed | | | | | | | | |
| | c | 1.6 | 0.0 | 0.20 | 70.0 | 4.00 | 0.25 | Balance | 4.00 | 0.25 |
| | d | 1.6 | 0.0 | 0.20 | 70.0 | 4.00 | 0.25 | Balance | 4.00 | 0.25 |
| | e | 1.5 | 0.3 | \*0.60 | 45.0 | 4.00 | 0.25 | Balance | 4.00 | 0.25 |
| | f | \*TiZrN film is formed by magnetron sputtering method. | | | | | | | | |
| | g | \*TiZrN film is formed by magnetron sputtering method and held in vacuum at 850° C. for 4 hours. | | | | | | | | |

Formation conditions of complex nitride layer (TiZrN layer · TiZrHfN layer)

First step (primary nucleus formation step)

ZrN · ZrHfN film formation step

| | Formation of complex nitride layer (TiZrN layer · TiZrHfN layer) | Phase difference between supply of gas group A and supply of gas group B | Reaction atmosphere | | Reaction gas group C composition (volume %) | | Etching step Processing time | Reaction atmosphere | |
|---|---|---|---|---|---|---|---|---|---|
| Step | Formation symbol | (seconds) | Pressure (kPa) | Temperature (° C.) | TiCl$_4$ | H$_2$ | (seconds) | Pressure (kPa) | Temperature (° C.) |
| Film formation step of present invention | A | 0.25 | 26 | 1060 | 3.0 | Balance | 120 | 7 | 1060 |
| | B | 0.15 | 33 | 1060 | 3.0 | Balance | 120 | 7 | 1060 |
| | C | 0.25 | 26 | 1060 | 3.0 | Balance | 120 | 7 | 1060 |
| | D | 0.50 | 26 | 1060 | 3.0 | Balance | 120 | 7 | 1060 |
| | E | 0.25 | 33 | 1020 | 3.0 | Balance | 240 | 10 | 1020 |
| | F | 0.25 | 18 | 1075 | 3.0 | Balance | 120 | 7 | 1080 |
| | G | 0.25 | 33 | 1020 | 3.0 | Balance | 240 | 10 | 1020 |
| Film formation step of comparative example | a | 0.15 | \*45 | 1060 | 3.0 | Balance | 240 | 10 | 1060 |
| | b | \*primary nucleus formation step is not performed | | | | | | | |
| | c | 0.25 | 26 | 1060 | 3.0 | Balance | 120 | 7 | 1060 |
| | d | 0.25 | 26 | 1060 | 3.0 | Balance | 120 | 7 | 1060 |
| | e | 0.25 | 33 | 1020 | 3.0 | Balance | 240 | 10 | 1020 |
| | f | \*TiZrN film is formed by magnetron sputtering method. | | | | | | | |
| | g | \*TiZrN film is formed by magnetron sputtering method and held in vacuum at 850° C. for 4 hours. | | | | | | | |

Formation of complex nitride layer (TiZrN layer · TiZrHfN layer) — Formation conditions of complex nitride layer (TiZrN layer · TiZrHfN layer)

Second step (crystal growth step)

| | | Gas group D composition (volume %) | | | | | Gas group D Supply period | Supply time per period |
|---|---|---|---|---|---|---|---|---|
| Step | Formation symbol | TiCl$_4$ | ZrCl$_4$ | HfCl$_4$ | HCl | H$_2$ | (seconds) | (seconds) |
| Film formation step of present invention | A | 0.50 | 1.6 | 0.0 | 0.20 | 70 | 4.00 | 0.25 |
| | B | 0.30 | 0.1 | 1.0 | 0.30 | 45 | 2.50 | 0.17 |
| | C | 0.65 | 0.1 | 1.5 | 0.20 | 70 | 4.00 | 0.25 |
| | D | 0.25 | 1.6 | 0.0 | 0.20 | 70 | 8.00 | 0.50 |
| | E | 0.50 | 1.5 | 0.3 | 0.35 | 45 | 4.00 | 0.25 |
| | F | 0.35 | 1.2 | 0.0 | 0.15 | 80 | 4.00 | 0.25 |
| | G | 0.35 | 1.5 | 0.3 | 0.20 | 45 | 4.00 | 0.25 |
| Film formation step of comparative example | a | 0.50 | 1.5 | 0.3 | 0.20 | 45 | 4.00 | 0.25 |
| | b | 0.50 | 1.6 | 0.0 | 0.20 | 70 | 4.00 | 0.25 |
| | c | \*1.00 | 1.6 | 0.0 | 0.20 | 70 | 4.00 | 0.25 |
| | d | \*0.10 | 1.6 | 0.0 | 0.20 | 70 | 4.00 | 0.25 |
| | e | 0.50 | 1.5 | 0.3 | \*0.60 | 45 | 4.00 | 0.25 |
| | f | \*TiZrN film is formed by magnetron sputtering method. | | | | | | |
| | g | \*TiZrN film is formed by magnetron sputtering method and held in vacuum at 850° C. for 4 hours. | | | | | | |

TABLE 5-continued

| | | Formation conditions of complex nitride layer (TiZrN layer · TiZrHfN layer) | | | | | |
|---|---|---|---|---|---|---|---|
| | | Second step (crystal growth step) | | | | | |
| Formation of complex nitride layer (TiZrN layer · TiZrHfN layer) | | Reaction gas group E | Gas group E | | Phase difference between supply of gas group A and supply of gas group B (seconds) | Reaction atmosphere | |
| Step | Formation symbol | composition (volume %) $N_2$ | Supply period (seconds) | Supply time per period (seconds) | | Pressure (kPa) | Temperature (°C.) |
| Film formation step of present invention | A | Balance | 4.00 | 0.25 | 0.25 | 26 | 1060 |
| | B | Balance | 2.50 | 0.17 | 0.15 | 33 | 1060 |
| | C | Balance | 4.00 | 0.25 | 0.25 | 26 | 1060 |
| | D | Balance | 8.00 | 0.50 | 0.50 | 26 | 1060 |
| | E | Balance | 4.00 | 0.25 | 0.25 | 33 | 1020 |
| | F | Balance | 4.00 | 0.25 | 0.25 | 18 | 1075 |
| | G | Balance | 4.00 | 0.25 | 0.25 | 33 | 1020 |
| Film formation step of comparative example | a | Balance | 4.00 | 0.25 | 0.25 | *45 | 1060 |
| | b | Balance | 4.00 | 0.25 | 0.25 | 26 | 1060 |
| | c | Balance | 4.00 | 0.25 | 0.25 | 26 | 1060 |
| | d | Balance | 4.00 | 0.25 | 0.25 | 26 | 1060 |
| | e | Balance | 4.00 | 0.25 | 0.25 | 33 | 1020 |
| | f | *TiZrN film is formed by magnetron sputtering method. | | | | | |
| | g | *TiZrN film is formed by magnetron sputtering method and held in vacuum at 850° C. for 4 hours. | | | | | |

Note1)
*indicates that the value is beyond the range of the condition.

Note2)
Gas composition of the gas group A and the gas group B shows volume % of each gas component, in a case where a total content of the gas group A and the gas group B supplied per one period is 100%.

Note3)
Gas composition of the gas group D and the gas group E shows volume % of each gas component, in a case where a total content of the gas group D and the gas group E supplied per one period is 100%.

| | | | Hard coating layer | | | | | | | | |
|---|---|---|---|---|---|---|---|---|---|---|---|
| | | | Lower layer (Numerical value at the bottom indicates desired average layer thickness (μm) of each layer.) | | | Complex nitride layer (TiZrN layer or TiZrHfN layer) | | | | | |
| | | | | | | | | | | X | Y |
| Type | | Tool body symbol | First layer | Second layer | Third layer | Formation symbol | Ti | Zr | Hf | Atomic ratio of each metal element in all metal elements [(Zr + Hf)/(Ti + Zr + Hf)] $0.05 \le x \le 0.95$ | [Zr/(Zr + Hf)] $0 < y \le 1.0$ |
| Coated tool of present invention | 1 | A | — | — | — | A | 0.65 | 0.35 | 0.00 | 0.35 | 1.00 |
| | 2 | B | — | — | — | B | 0.26 | 0.07 | 0.67 | 0.74 | 0.10 |
| | 3 | C | — | — | — | C | 0.92 | 0.01 | 0.07 | 0.08 | 0.13 |
| | 4 | D | — | — | — | D | 0.09 | 0.91 | 0.00 | 0.91 | 1.00 |
| | 5 | E | — | — | — | E | 0.85 | 0.13 | 0.02 | 0.15 | 0.87 |
| | 6 | A | TiN (0.6) | — | — | F | 0.63 | 0.37 | 0.00 | 0.37 | 1.00 |
| | 7 | B | TiN (0.2) | l-TiCN (8) | — | G | 0.49 | 0.43 | 0.08 | 0.51 | 0.84 |
| | 8 | B | TiN (0.2) | l-TiCN (5) | α-Al$_2$O$_3$ (3) | A | 0.64 | 0.36 | 0.00 | 0.36 | 1.00 |
| | 9 | B | TiN (0.2) | l-TiCN (5) | κ-Al$_2$O$_3$ (3) | B | 0.26 | 0.07 | 0.67 | 0.74 | 0.10 |
| | 10 | B | TiN (0.2) | l-TiCN (5) | — | C | 0.92 | 0.01 | 0.07 | 0.08 | 0.13 |
| | 11 | B | TiN (0.2) | l-TiCN (3) | — | D | 0.08 | 0.92 | 0.00 | 0.92 | 1.00 |
| | 12 | C | TiC (0.5) | TiN (0.5) | TiCN (3) | E | 0.85 | 0.13 | 0.02 | 0.15 | 0.87 |
| | 13 | D | TiN (1) | — | — | F | 0.64 | 0.36 | 0.00 | 0.36 | 1.00 |
| | 14 | E | TiN (0.5) | TiC (0.5) | l-TiCN (8) | G | 0.49 | 0.43 | 0.08 | 0.51 | 0.84 |

-continued

| | | | Hard coating layer | | | | |
|---|---|---|---|---|---|---|---|
| | | | Complex nitride layer (TiZrN layer or TiZrHfN layer) | | | | Upper layer (Numerical value at the bottom indicates desired average layer thickness (μm) of each layer.) |
| Type | Tool body symbol | Cl amount Atom % 0.001-0.030 | Area ratio of crystal grain structure having aspect ratio equal to or greater than 2 (%) | Layer thickness (μm) | Nanoindentation hardness (indentation load of 200 mgf) (kgf/mm$^2$) | First layer | Second layer |
| Coated tool of present invention | 1 A | 0.010 | 69 | 5 | 3530 | — | — |
| | 2 B | 0.013 | 52 | 12 | 3220 | — | — |
| | 3 C | 0.010 | 72 | 18 | 3270 | — | — |
| | 4 D | 0.009 | 63 | 12 | 2640 | — | — |
| | 5 E | 0.025 | 55 | 12 | 2650 | — | — |
| | 6 A | 0.004 | 90 | 2.5 | 3810 | — | — |
| | 7 B | 0.019 | 60 | 1.5 | 2480 | — | — |
| | 8 B | 0.009 | 84 | 3 | 3510 | — | — |
| | 9 B | 0.012 | 66 | 0.5 | 3290 | — | — |
| | 10 B | 0.011 | 92 | 3 | 3270 | α-Al$_2$O$_3$ (3) | — |
| | 11 B | 0.010 | 78 | 3 | 2630 | l-TiCN (2) | α-Al$_2$O$_3$ (3) |
| | 12 C | 0.026 | 63 | 3 | 2650 | — | — |
| | 13 D | 0.003 | 86 | 12 | 3640 | — | — |
| | 14 E | 0.018 | 62 | 3 | 2500 | — | — |

TABLE 7

| | | Hard coating layer | | | | | | | | |
|---|---|---|---|---|---|---|---|---|---|---|
| | | Lower layer (Numerical value at the bottom indicates desired average layer thickness (μm) of each layer.) | | | Complex nitride layer (TiZrN layer · TiZrHfN layer) | | | | | |
| | | | | | | Atomic ratio of each metal element in all metal elements | | | X | Y |
| Type | Tool body symbol | First layer | Second layer | Third layer | Formation symbol | Ti | Zr | Hf | [(Zr + Hf)/(Ti + Zr + Hf)] 0.05 ≤ x ≤ 0.95 | [Zr/(Zr + Hf)] 0 < y ≤ 1.0 |
| Coated tool of comparative example | 1 A | — | — | — | a | 0.22 | 0.65 | 0.13 | 0.78 | 0.83 |
| | 2 B | — | — | — | b | 0.65 | 0.35 | 0.00 | 0.35 | 1.00 |
| | 3 C | — | — | — | c | 0.98 | 0.02 | 0.00 | *0.02 | 1.00 |
| | 4 D | — | — | — | d | 0.03 | 0.97 | 0.00 | *0.97 | 1.00 |
| | 5 E | — | — | — | e | 0.85 | 0.13 | 0.02 | 0.15 | 0.87 |
| | 6 A | TiN (0.6) | — | — | f | 0.25 | 0.75 | 0.00 | 0.75 | 1.00 |
| | 7 B | TiN (0.2) | l-TiCN (8) | — | g | 0.25 | 0.75 | 0.00 | 0.75 | 1.00 |
| | 8 B | TiN (0.2) | l-TiCN (5) | α-Al$_2$O$_3$ (3) | a | 0.23 | 0.64 | 0.13 | 0.77 | 0.83 |
| | 9 B | TiN (0.2) | l-TiCN (5) | κ-Al$_2$O$_3$ (3) | b | 0.65 | 0.35 | 0.00 | 0.35 | 1.00 |
| | 10 B | TiN (0.2) | l-TiCN (5) | — | c | 0.98 | 0.02 | 0.00 | *0.02 | 1.00 |
| | 11 B | TiN (0.2) | l-TiCN (3) | — | d | 0.03 | 0.97 | 0.00 | *0.97 | 1.00 |
| | 12 C | TiC (0.5) | TiN (0.5) | TiCN (3) | e | 0.84 | 0.14 | 0.02 | 0.16 | 0.88 |
| | 13 D | TiN (1) | — | — | f | 0.25 | 0.75 | 0.00 | 0.75 | 1.00 |
| | 14 E | TiN (0.5) | TiC (0.5) | l-TiCN (8) | g | 0.25 | 0.75 | 0.00 | 0.75 | 1.00 |
| | 15 B | TiN (0.2) | l-TiCN (5) | Al$_2$O$_3$ (3) | B | 0.26 | 0.07 | 0.67 | 0.74 | 0.10 |
| | 16 B | TiN (0.2) | l-TiCN (5) | Al$_2$O$_3$ (3) | B | 0.26 | 0.07 | 0.67 | 0.74 | 0.10 |

TABLE 7-continued

| | | | Hard coating layer | | | | |
|---|---|---|---|---|---|---|---|
| | | | Complex nitride layer (TiZrN layer · TiZrHfN layer) | | | | Upper layer (Numerical value at the bottom indicates desired average layer thickness (μm) of each layer.) |
| Type | Tool body symbol | Cl amount Atom % 0.001-0.030 | Area ratio of crystal grain structure having aspect ratio equal to or greater than 2 (%) | Layer thickness (μm) | Nanoindentation hardness (indentation load of 200 mgf) (kgf/mm²) | First layer | Second layer |
| Coated tool of comparative example | 1 A | 0.012 | *47 | 6 | 2720 | — | — |
| | 2 B | 0.014 | *5 | 12 | 3090 | — | — |
| | 3 C | 0.010 | 77 | 18 | 2420 | — | — |
| | 4 D | 0.019 | 52 | 12 | 2280 | — | — |
| | 5 E | *0.037 | 64 | 12 | 3350 | — | — |
| | 6 A | *0.000 | *2 | 2.5 | 3330 | — | — |
| | 7 B | *0.000 | 71 | 3 | 2620 | — | — |
| | 8 B | 0.012 | *47 | 3 | 2730 | — | — |
| | 9 B | 0.015 | *13 | 0.5 | 3190 | — | — |
| | 10 B | 0.010 | 81 | 3 | 2450 | α-Al₂O₃ (3) | — |
| | 11 B | 0.019 | 56 | 3 | 2260 | l-TiCN (2) | α-Al₂O₃ (3) |
| | 12 C | *0.036 | 66 | 3 | 3340 | — | — |
| | 13 D | *0.000 | *2 | 3 | 3330 | — | — |
| | 14 E | *0.000 | 72 | 3 | 2710 | — | — |
| | 15 B | 0.013 | 66 | *23 | 3290 | — | — |
| | 16 B | 0.012 | 65 | *0.1 | Not measureable | — | — |

Note)
*indicates that the value is beyond the range of the invention shown in Claim 1.

Next, in a state in which each of the various coated tools was clamped to a tip end portion of a cutting tool made of tool steel by a fixing tool, the coated tool of the present inventions 1 to 14 and the coated tool of comparative examples 1 to 16 were subjected to a high-speed feed intermittent cutting test, shown below, a flank wear width of the cutting edge was measured, and presence or absence of the occurrence of adhesion was observed. The results are shown in Table 8.

<<Cutting Conditions A>>
Cutting test: alloy steel dry type high-speed high feed intermittent cutting test
Work material: a round bar of JIS SCM440 with eight longitudinal grooves formed with equal intervals in the longitudinal direction
Cutting speed: 220 m/min
Depth of cut: 2.0 mm
Feed: 0.75 mm/rev.
Cutting time: 5 minutes <<Cutting Conditions B>>
Cutting test: carbon steel dry type high-speed high feed intermittent cutting test
Work material: a round bar of JIS S45C with two longitudinal grooves in the longitudinal direction
Cutting speed: 275 m/min
Depth of cut: 2.0 mm
Feed: 0.75 mm/rev.
Cutting time: 10 minutes

TABLE 8

| | | Cutting test result | | | | | | Cutting test result | | | |
|---|---|---|---|---|---|---|---|---|---|---|---|
| | | Cutting conditions A | | Cutting conditions B | | | | Cutting conditions A | | Cutting conditions B | |
| Type | | Occurrence of peeling · chipping | Flank maximum wear width (mm) | Occurrence of peeling · chipping | Flank maximum wear width (mm) | Type | | Occurrence of peeling · chipping | Flank maximum wear width (mm) | Occurrence of peeling · chipping | Flank maximum wear width (mm) |
| Coated tool of present invention | 1 | None | 0.18 | None | 0.13 | Coated tool of comparative examples | 1 | **1.9 | — | **5.5 | — |
| | 2 | None | 0.15 | None | 0.15 | | 2 | **2.2 | — | **3.9 | — |
| | 3 | None | 0.13 | None | 0.14 | | 3 | **3.2 | — | **5.2 | — |
| | 4 | None | 0.15 | None | 0.16 | | 4 | **2.3 | — | **6.1 | — |
| | 5 | None | 0.16 | None | 0.19 | | 5 | **3.0 | — | **4.0 | — |
| | 6 | None | 0.14 | None | 0.15 | | 6 | **3.7 | — | **8.8 | — |
| | 7 | None | 0.28 | None | 0.27 | | 7 | **2.5 | — | **4.3 | — |
| | 8 | None | 0.12 | None | 0.09 | | 8 | **3.6 | — | **5.1 | — |
| | 9 | None | 0.32 | None | 0.25 | | 9 | **1.9 | — | **3.4 | — |
| | 10 | None | 0.14 | None | 0.08 | | 10 | **2.4 | — | **5.6 | — |
| | 11 | None | 0.13 | None | 0.10 | | 11 | **2.8 | — | **7.7 | — |
| | 12 | None | 0.15 | None | 0.16 | | 12 | **3.0 | — | **5.3 | — |
| | 13 | None | 0.18 | None | 0.15 | | 13 | **3.1 | — | **6.0 | — |

TABLE 8-continued

| | Cutting test result | | | | | Cutting test result | | | |
| | Cutting conditions A | | Cutting conditions B | | | Cutting conditions A | | Cutting conditions B | |
| Type | Occurrence of peeling · chipping | Flank maximum wear width (mm) | Occurrence of peeling · chipping | Flank maximum wear width (mm) | Type | Occurrence of peeling · chipping | Flank maximum wear width (mm) | Occurrence of peeling · chipping | Flank maximum wear width (mm) |
| --- | --- | --- | --- | --- | --- | --- | --- | --- | --- |
| 14 | None | 0.29 | None | 0.30 | 14 | **2.5 | — | **7.2 | — |
| | | | | | 15 | *2.1 | — | *3.4 | — |
| | | | | | 16 | **3.7 | — | **5.1 | — |

A symbol * in the column of "Occurrence of peeling · chipping" indicates the cutting time till the lifetime of the usage is reached (flank maximum wear width equal to or greater than 0.4 mm) due to the peeling occurred on the hard coating layer, and a symbol ** indicates the cutting time till the lifetime of the usage is reached due to the chipping occurrence on the hard coating layer.
A symbol — in the column of "Flank maximum wear width" shows that the flank maximum wear width after the processing or during the lifetime is equal to or greater than 0.4 mm.

As clearly shown from the results of the cutting test of Table 8, the coated tool of the present invention includes the complex nitride layer formed of TiZrN complex nitride or TiZrHfN complex nitride having the desired composition containing chlorine and longitudinal crystal structure, shown in Table 6, as the hard coating layer. Accordingly, during the high-speed high feed intermittent cutting of steel, peeling or chipping does not occur, the maximum flank wear width is also small, and exceptional peeling resistance, chipping resistance, and wear resistance are exhibited.

In contrast, in the coated tool of comparative examples, the complex nitride layer included as the hard coating layer does not satisfy the desired composition or does not have the longitudinal crystal structure. Therefore, the desired properties are not obtained, and the end of lifetime was reached at an early stage due to a progress of wear, occurrence of adhesion, occurrence of chipping, and the like.

INDUSTRIAL APPLICABILITY

As described above, the coated tool of the invention is exceptional in cutting of steel under high-speed high feed intermittent cutting conditions of high efficiency, and exhibits adhesion resistance, chipping resistance, and wear resistance. Therefore, the high performance of the cutting device, labor saving, energy saving, and cost saving of the cutting tool are sufficiently satisfied.

What is claimed is:

1. A surface-coated cutting tool comprising:
a tool body composed of a cemented carbide comprising WC or a cermet comprising TiCN; and
at least one hard coating layer provided on a surface of the tool body, wherein
1) the hard coating layer includes at least one complex nitride layer in which, in a case where the complex nitride layer is expressed by a compositional formula $(Ti_{(1-x)}Zr_{xy}Hf_{x(1-y)})N$, x and y satisfy $0.05 \leq x \leq 0.95$ and $0 < y \leq 1.0$, respectively, where x is a content ratio of a total amount of Zr and Hf to a total amount of Ti, Zr, and Hf, and y is a content ratio of Zr to a total amount of Zr and Hf (here, all of x and y are atomic ratios);
2) the complex nitride layer contains 0.001 to 0.030 atom % of chlorine;
3) in the complex nitride layer, an area ratio of longitudinal crystal grains having an aspect ratio equal to or greater than 2 occupying a longitudinal cross section is 50% or more; and
4) a layer thickness of the complex nitride layer is 0.2 μm or more and 20 μm or less.

2. The surface-coated cutting tool according to claim 1, wherein the complex nitride layer has:
1) a nanoindentation hardness of 2,600 kgf/mm$^2$ or more in a case where an indentation load is 200 mgf; and
2) a layer thickness of 1 μm or more and 20 μm or less.

3. The surface-coated cutting tool according to claim 1, wherein y satisfies $0 < y < 1.0$.

4. The surface-coated cutting tool according to claim 1, wherein x satisfies $0.08 \leq x \leq 0.92$, y satisfies $0.1 \leq y \leq 1.0$, the complex nitride layer contains 0.003 to 0.026 atom % of chlorine, and the complex nitride layer contains no carbon.

5. The surface-coated cutting tool according to claim 1, wherein the complex nitride layer is formed by a method comprising:
a first primary nucleus formation step of forming primary nucleus for forming a TiZrN film or a TiZrHfN film, and
a second crystal growth step of growing the primary nuclei to form the TiZrN film or the TiZrHfN film,
wherein the first primary nucleus formation step comprises:
a seed film formation step of forming a ZrN film or a ZrHfN film which are seed films, and
an etching step of etching a surface of the ZrN film or the ZrHfN film formed in the seed film formation step to substitute a part of Zr with Ti, and obtaining the primary nucleus of TiZrN or TiZrHfN.

* * * * *